(12) United States Patent
Scott et al.

(10) Patent No.: US 12,494,745 B2
(45) Date of Patent: Dec. 9, 2025

(54) AMPLITUDE MODULATION-PHASE MODULATION (AM-PM) LINEARIZATION IN A POWER AMPLIFIER

(71) Applicant: Qorvo US, Inc., Greensboro, NC (US)

(72) Inventors: Baker Scott, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 655 days.

(21) Appl. No.: 17/659,221

(22) Filed: Apr. 14, 2022

(65) Prior Publication Data

US 2023/0336127 A1 Oct. 19, 2023

(51) Int. Cl.
*H03F 1/22* (2006.01)
*H03F 1/32* (2006.01)
*H03F 3/24* (2006.01)

(52) U.S. Cl.
CPC ........... *H03F 1/223* (2013.01); *H03F 1/3241* (2013.01); *H03F 3/245* (2013.01); *H03F 2200/451* (2013.01)

(58) Field of Classification Search
CPC ........ H03F 1/223; H03F 1/3241; H03F 3/245; H03F 2200/451; H03F 3/193; H03F 1/22; H03F 2200/294; H03F 3/16; H03F 3/1935; H03F 2200/372
USPC .......................................................... 330/311
See application file for complete search history.

(56) References Cited

U.S. PATENT DOCUMENTS

| | | | |
|---|---|---|---|
| 6,292,060 B1 * | 9/2001 | Yeo ........................... | H03F 1/56 330/305 |
| 6,803,824 B2 | 10/2004 | Rategh et al. | |
| 6,850,120 B2 | 2/2005 | Heima et al. | |
| 7,276,976 B2 | 10/2007 | Oh et al. | |
| 7,295,064 B2 | 11/2007 | Shiikuma et al. | |
| 7,741,910 B2 | 6/2010 | Wong | |
| 7,821,349 B2 * | 10/2010 | Park .......................... | H03F 1/26 331/117 FE |
| 8,111,104 B2 | 2/2012 | Ahadian et al. | |
| 8,120,428 B2 | 2/2012 | Montalvo et al. | |
| 8,493,154 B1 | 7/2013 | Camargo et al. | |
| 8,648,656 B2 | 2/2014 | Nozaki et al. | |
| 8,686,796 B2 * | 4/2014 | Presti ...................... | H03F 1/223 330/311 |

(Continued)

FOREIGN PATENT DOCUMENTS

EP 2618481 A1 7/2013

OTHER PUBLICATIONS

U.S. Appl. No. 17/659,217, filed Apr. 14, 2022.
(Continued)

*Primary Examiner* — Khanh V Nguyen
(74) *Attorney, Agent, or Firm* — Withrow & Terranova, P.L.L.C.

(57) ABSTRACT

Amplitude modulation-phase modulation (AM-PM) linearization in power amplifier techniques are disclosed. In one aspect, a fixed capacitor is placed in parallel to a cascode device within a power amplifier. The sum of capacitances from the cascode device and the parallel capacitor may be relatively fixed across voltage swings, allowing for small phase changes across a wide range of signal amplitudes passing through the power amplifier. The small phase changes across voltage swings make it easier to provide compensation for such phase changes resulting in a more efficient device.

20 Claims, 7 Drawing Sheets

(56) References Cited

U.S. PATENT DOCUMENTS

| | | |
|---|---|---|
| 8,779,860 B2 | 7/2014 | Jeon et al. |
| 8,847,689 B2 | 9/2014 | Zhao et al. |
| 9,362,872 B2 | 6/2016 | Park et al. |
| 9,413,309 B1* | 8/2016 | Zhao .................. H03F 3/45188 |
| 9,621,110 B1* | 4/2017 | Boyavalle ................ H03F 3/21 |
| 10,020,780 B2* | 7/2018 | Shimura ............... H03F 1/3211 |
| 11,711,057 B2 | 7/2023 | Lehtola |
| 2003/0193371 A1 | 10/2003 | Larson et al. |
| 2011/0037519 A1 | 2/2011 | Pletcher et al. |
| 2011/0304395 A1 | 12/2011 | Koo et al. |
| 2012/0146722 A1 | 6/2012 | Scott et al. |
| 2013/0154744 A1 | 6/2013 | Samavedam et al. |
| 2013/0176077 A1 | 7/2013 | Pai et al. |
| 2016/0173036 A1 | 6/2016 | Vogt et al. |
| 2017/0207758 A1 | 7/2017 | Tseng et al. |
| 2020/0007088 A1 | 1/2020 | Ranta et al. |
| 2022/0078051 A1* | 3/2022 | Siddamurthy ...... H03F 3/45192 |
| 2023/0163734 A1 | 5/2023 | Scott et al. |
| 2023/0318537 A1* | 10/2023 | Scott ..................... H03F 1/3276 |
| | | 330/136 |
| 2023/0336127 A1* | 10/2023 | Scott ....................... H03F 1/223 |
| 2023/0336128 A1 | 10/2023 | Scott et al. |

OTHER PUBLICATIONS

U.S. Appl. No. 17/706,985, filed Mar. 29, 2022.
Sowlati, T. et al., "A 2.4-GHz 0.18-µm CMOS Self-Biased Cascode Power Amplifier," IEEE Journal of Solid-State Circuits, vol. 38, No. 8, Aug. 2003, IEEE, pp. 1318-1324.
Extended European Search Report for European Patent Application No. 23165650.5, mailed Sep. 7, 2023, 12 pages.
Fu, J. et al., "A 2.4G-Hz CMOS Power Amplifier," 2010 10th IEEE International Conference on Solid-State and Integrated Circuit Technology, Nov. 1-4, 2010, Shanghai, China, IEEE, 3 pages.
Extended European Search Report for European Patent Application No. 23161975.0, mailed Aug. 31, 2023, 15 pages.

* cited by examiner

AMPLITUDE MODULATION-PHASE MODULATION (AM-PM) LINEARIZATION IN A POWER AMPLIFIER

BACKGROUND

I. Field of the Disclosure

The technology of the disclosure relates generally to power amplifiers and, more particularly, to power amplifiers with separate transconductance and transimpedance devices that may need improved phase linearity across multiple power levels.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The advent of the fifth generation-new radio (5G-NR) cellular standards, and particularly the use of millimeter wave signals creates challenges for power amplifiers used in the transmission chains of such mobile communication devices. Accordingly, there is room for innovation for the power amplifiers.

SUMMARY

Aspects disclosed in the detailed description include amplitude modulation-phase modulation (AM-PM) linearization in a power amplifier. In particular, exemplary aspects of the present disclosure provide a fixed capacitor in parallel to a cascode device within a power amplifier. The sum of capacitances from the cascode device and the parallel capacitor may be relatively fixed across voltage swings, allowing for small phase changes across a wide range of signal amplitudes passing through the power amplifier. The small phase changes across voltage swings make it easier to provide compensation for such phase changes resulting in a higher linearity power amplifier while also consuming less power, and thus overall being a more efficient device.

In this regard, in one aspect, a power amplifier stage is disclosed. The power amplifier stage comprises a cascode device. The power amplifier stage also comprises a fixed value capacitor coupled in parallel with the cascode device. The fixed value capacitor is configured to act as a variable capacitor as a function of a radio frequency (RF) signal.

In another aspect, a power amplifier device is disclosed. The power amplifier device comprises a first stage comprising a first transistor coupled electrically in parallel to a fixed value capacitor. The fixed value capacitor is configured to act as a variable capacitor as a function of an RF signal. The power amplifier device also comprises a second stage comprising a second transistor.

In another aspect, a power amplifier device is disclosed. The power amplifier device comprises a first stage comprising a first transistor having coupled electrically in parallel a first fixed value capacitor. The first fixed value capacitor is configured to act as a variable capacitor as a function of an RF signal. The power amplifier device also comprises a second stage comprising a second transistor having coupled electrically in parallel a second fixed value capacitor. The second fixed value capacitor is configured to act as a variable capacitor as a function of an RF signal.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include amplitude modulation-phase modulation (AM-PM) linearization in a power amplifier. In particular, exemplary aspects of the present disclosure provide a fixed capacitor in parallel to a cascode device within a power amplifier. The sum of capacitances from the cascode device and the parallel capacitor may be relatively fixed across voltage swings, allowing for small phase changes across a wide range of signal amplitudes passing through the power amplifier. The small phase changes across voltage swings make it easier to provide compensation for such phase changes resulting in a higher linearity power amplifier while also consuming less power, and thus overall being a more efficient device.

More specifically, at small to medium negative voltages, the cascode device is active and presents little capacitive loading to the signal path. Accordingly, the parallel capacitor dominates since it has different signals on its two terminals. In contrast, at high negative voltages, the cascode device may be crushed, acting, for example, in a triode mode, causing the parallel capacitor to be bootstrapped (i.e., the parallel capacitor has a low loading effect on the signal path, since both its terminals are effectively seeing the same signal) and allowing an inherent capacitance of the cascode device to dominate. In this fashion, the sum of the capacitances provided by the cascode device and the parallel capacitor remains relatively constant across voltage swings, which in turn causes any phase change (e.g., phase delay) to be small. The small phase change allows for simpler compensation solutions.

Before addressing particular exemplary aspects of the AM-PM linearization, a brief overview of a source of a phase change is discussed with reference to FIGS. 1A-2B. This induced phase change generated by a non-linear capacitive loading of the signal path leads to non-linear phase behavior, which may require additional circuitry to compensate. The additional circuitry consumes more power and thus decreases overall efficiency and may lead to operation that does not comply with relevant wireless protocols. A discussion of exemplary aspects of the present disclosure begins below with reference to FIG. 3.

Figure 1A:
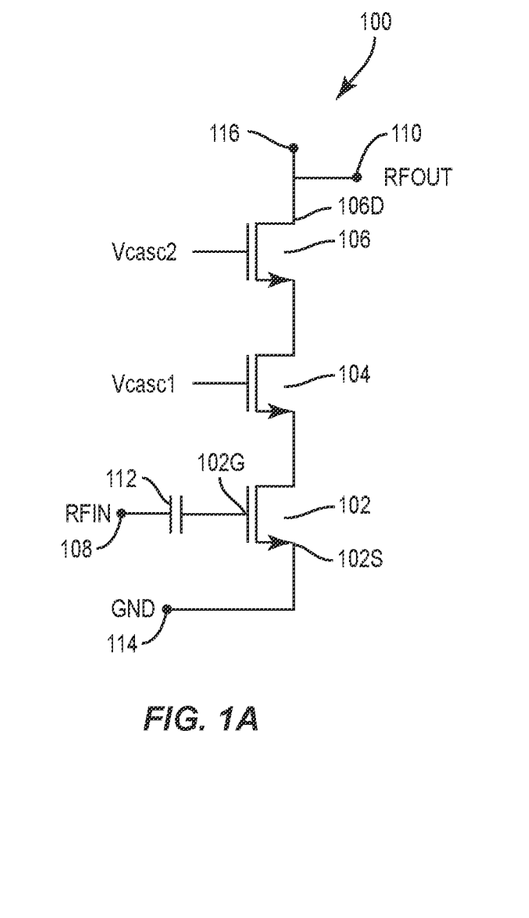
FIG. 1A is a circuit diagram of an exemplary conventional cascode power amplifier stage.
Figure 1B:
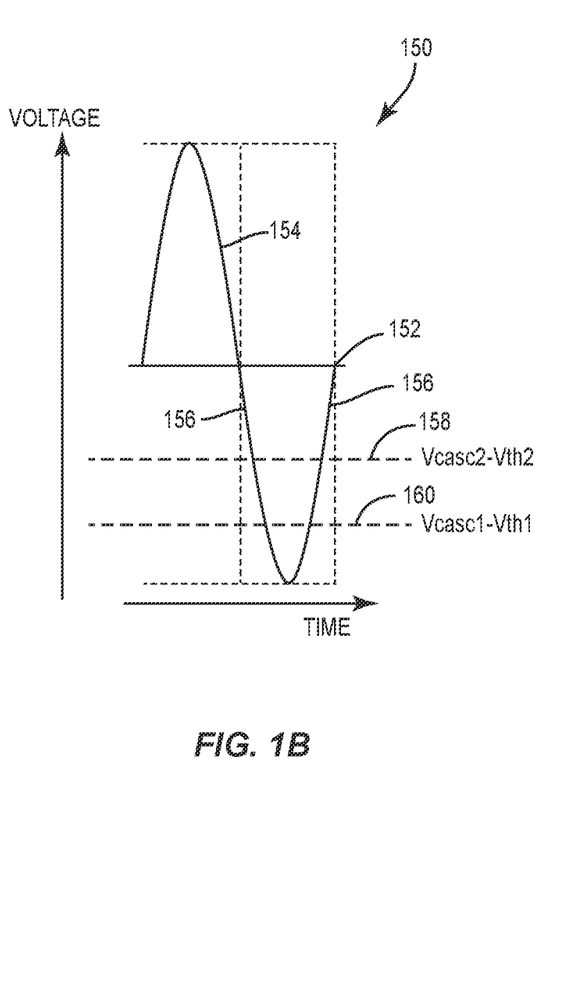
FIG. 1B is a graph of a power swing versus time showing where cascode transistors typically crush and enter triode mode during operation.

In this regard, FIG. 1A is circuit diagram of a power amplifier stage 100 formed from a transconductance device 102, a middle cascode device 104 and a top cascode transistor 106. As illustrated, the transconductance device 102, the middle cascode device 104, and the top cascode transistor 106 are formed from n-type field effect transistors (FETs) (NFETs). A signal to be amplified (e.g., RFIN) is provided at an input node 108, and an amplified signal (RFOUT) is provided at an output node 110. RFIN may pass through a blocking capacitor 112 to a gate 102G of the transconductance device 102. The transconductance device 102 provides the primary amplification to RFIN. The middle cascode device 104 and the top cascode transistor 106 are both cascodes relative to the transconductance device 102. A source 102S of the transconductance device 102 may be coupled to a ground 114, and a drain 106D of the top cascode transistor 106 may be coupled to the output node 110 and a supply voltage 116.

In normal use, at low signal swing levels, the transconductance device 102, the middle cascode device 104, and the top cascode transistor 106 operate in a saturation mode. However, at peak negative voltages, these devices may be "crushed" or enter a triode mode. This crushing occurs when the drain voltage is less than the gate voltage by more than a device threshold voltage. This concept is better illustrated by graph 150 in FIG. 1B, where the power amplifier stage 100 operates around a direct current (DC) voltage level 152. The transconductance device 102, the middle cascode device 104, and the top cascode transistor 106 operate in the saturation mode as long as the voltage level of RFOUT is above the DC voltage level 152 (generally shown by curve 154). Likewise, so long as curve 156 is above line 158, the transconductance device 102, the middle cascode device 104, and the top cascode transistor 106 operate in the saturation mode. However, at line 158, the drain voltage of the top cascode transistor 106 is more than a threshold Vth2 below the voltage of the gate voltage of the top cascode transistor 106, and the top cascode transistor 106 crushes (i.e., enters triode mode of operation). Likewise, when RFOUT passes below line 160, the drain voltage of the middle cascode device 104 is more than a threshold Vth1 below the voltage of the gate voltage of the middle cascode device 104, and the middle cascode device 104 crushes.

Figure 2A:
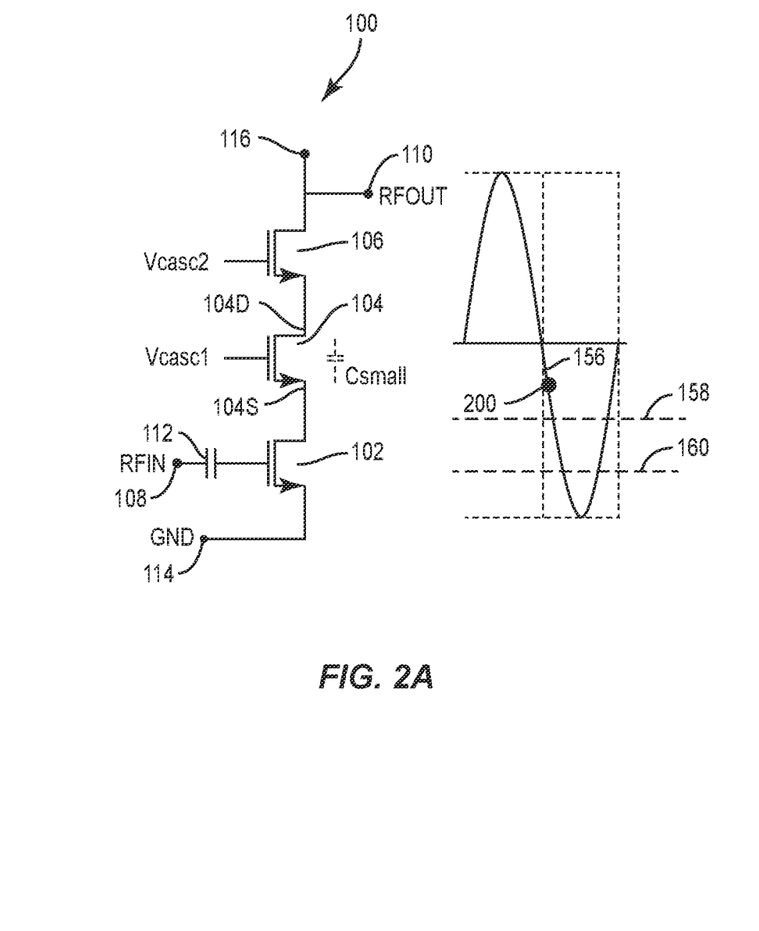
FIG. 2A is a circuit diagram showing an effective capacitance of a cascode device within the power amplifier stage at small to medium negative voltages.
Figure 2B:
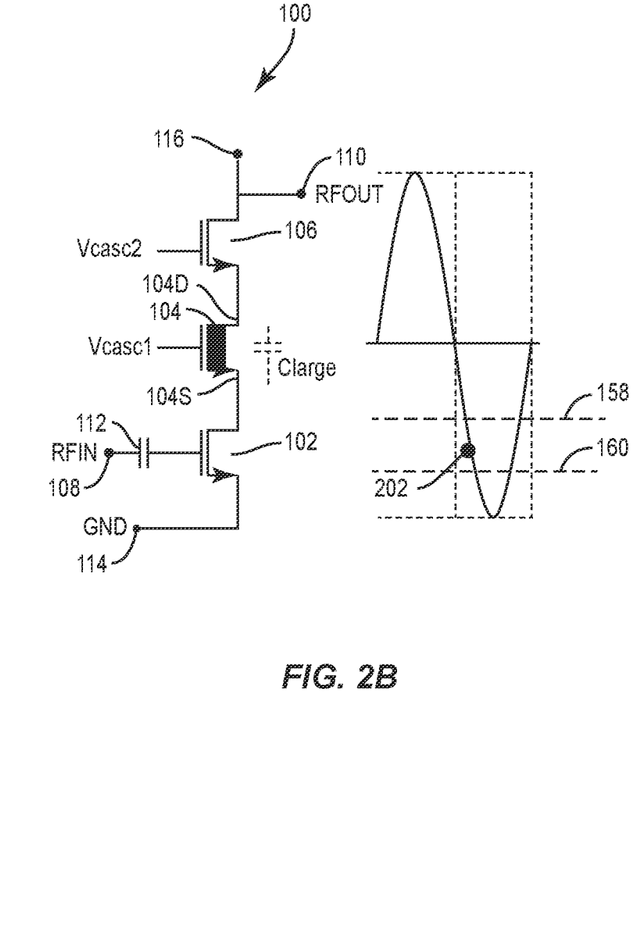
FIG. 2B is a circuit diagram showing an effective capacitance of the cascode device within the power amplifier stage at large negative voltages.

Operation in a triode mode also changes the effective capacitance of the middle cascode device 104. Thus, as shown in FIG. 2A, when the power amplifier stage 100 is in a saturation mode as shown by dot 200 on line 156, the loading capacitance between the drain 104D and the source 104S is relatively small (Csmall). This capacitance is shown by the dotted capacitor symbol to show its effective existence, even though there is not a specific capacitor element in the circuit. Conversely, when the middle cascode device 104 is crushed and in a triode mode as shown by dot 202 in FIG. 2B, the capacitance between the drain 104D and the source 104S is large (Clarge). Again, this capacitance is shown by the dotted capacitor symbol to show its effective existence, even though there is not a specific capacitor element in the circuit. The presence of a non-linear signal level variable capacitance in the power amplifier stage 100 introduces a power dependent phase delay in RFOUT, which constitutes distortion. The presence of a variable capacitance means that the phase delay is non-linear and accordingly harder to correct.

Exemplary aspects of the present disclosure contemplate adding an effectively variable capacitor in parallel to the middle cascode device. Specifically, a capacitor is added in parallel to the middle cascode device, but bootstrapping by the capacitor makes the equivalent capacitor function like a variable capacitor despite being a fixed capacitor in actuality. Thus, instead of trying to prevent the middle cascode device from crushing, exemplary aspects of the present disclosure embrace the crushed state of the middle cascode device and add an effectively variable capacitor in parallel. The sum of the capacitances loading the signal path from the middle cascode device and the parallel capacitor remains constant over changes in the RFOUT signal level, providing a more constant phase profile over power level. Likewise, the use of a fixed capacitance avoids the need for a variable capacitor such as a varactor, which are notoriously poor at the very high frequencies of interest (e.g., in the millimeter wave signal range common to 5G-NR).

Figure 3:
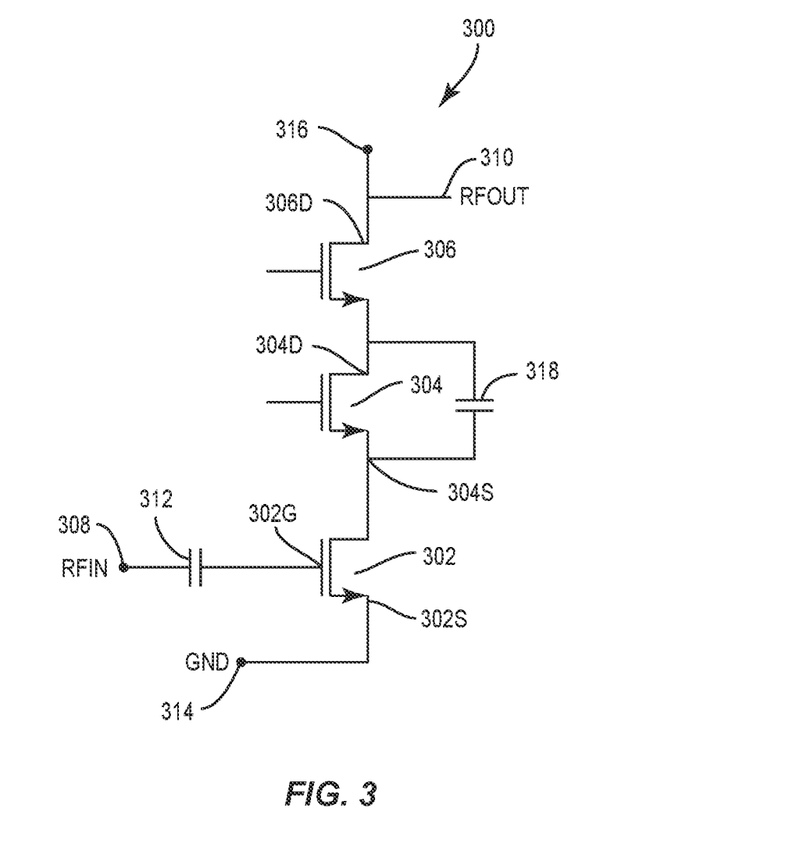
FIG. 3 is a circuit diagram of a cascode power amplifier stage with a parallel capacitor added to a cascode device to improve linearity of phase changes according to an exemplary aspect of the present disclosure.

In this regard, FIG. 3 illustrates a power amplifier stage 300 that includes a cascode structure similar to that of the power amplifier stage 100 and particularly includes a transconductance device 302, a middle cascode device 304, and a top cascode transistor 306. As illustrated, the transconductance device 302, the middle cascode device 304, and the top cascode transistor 306 are formed from NFETs. A signal to be amplified (e.g., RFIN) is provided at an input node 308 and an amplified signal (RFOUT) is provided at an output node 310. RFIN may pass through a blocking capacitor 312 to a gate 302G of the transconductance device 302. The transconductance device 302 provides the primary amplification to RFIN. The middle cascode device 304, and the top cascode transistor 306 are both cascodes relative to the transconductance device 302. A source 302S of the transconductance device 302 may be coupled to a ground 314, and a drain 306D of the top cascode transistor 306 may be coupled to the output node 310 and a supply voltage 316.

Figure 4A:
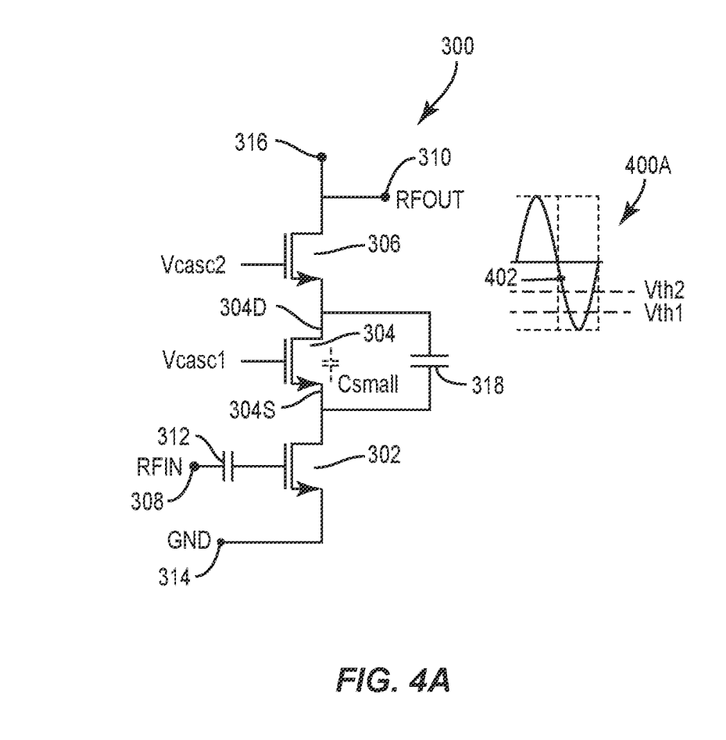
FIG. 4A is a circuit diagram showing an effective capacitance of the cascode device and the parallel capacitor within the power amplifier stage of FIG. 3 at small to medium negative voltages.
Figure 4B:
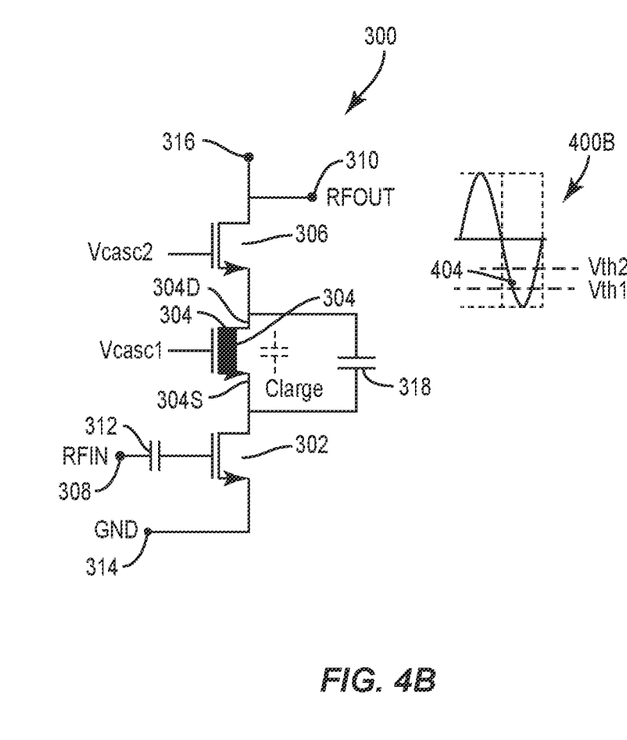
FIG. 4B is a circuit diagram showing an effective capacitance of the cascode device and the parallel capacitor within the power amplifier stage of FIG. 3 at large negative voltages.

A capacitor 318 having a fixed value is placed electrically in parallel to the middle cascode device 304. Specifically, the capacitor 318 is coupled to the drain 304D and the source 304S of the middle cascode device 304. Depending on the RF signal level, there will be a variable bootstrapping effect, which causes the capacitor 318 to appear to be variable, despite its inherently fixed nature. This variation is illustrated in FIGS. 4A and 4B. Specifically, as illustrated in FIG. 4A, when the middle cascode device 304 operates in a saturation mode (e.g., point 402 on graph 400A), the associated capacitance of the middle cascode device 304 is relatively small (Csmall) and the voltage difference between the drain 304D and the source 304S is relatively large. The Csmall capacitance is shown by the dotted capacitor symbol to show its effective existence, even though there is not a specific capacitor element in the circuit. This large voltage difference between the source 304S and the drain 304D means that the capacitor 318 will show its loading capacitive effect to the signal path.

In contrast, in FIG. 4B, the middle cascode device 304 is crushed (e.g., point 404 in graph 400B). Accordingly, there is little signal difference between the drain 304D and the source 304S and the effective capacitance of the middle cascode device 304 is relatively large (Clarge). Again, this capacitance is shown by the dotted capacitor symbol to show its effective existence, even though there is not a specific capacitor element in the circuit. However, because there is little signal difference between the drain 304D and the source 304S, the capacitor 318 is effectively bootstraped to show a very small or negligible capacitance to the signal path. Thus, even though the inherent capacitance of the capacitor 318 is fixed, the capacitor 318 functions as a variable capacitor as a function of the RF signal level.

While the example of the power amplifier stage 300 is shown using NFETs and a single cascoded stage, the teachings of the present disclosure are not so limited. The teachings of the present disclosure may also be applied to power amplifier stages formed from PFETs, complementary metal oxide semiconductor (CMOS) FET arrangements, bulk CMOS devices, silicon on insulator (SOI) CMOS devices, silicon on sapphire (SOS) CMOS devices, or the like. The SOI CMOS devices may be partially- or fully-depleted. Additionally, the transistors may be junction-gate FETs (JFETs), pseudomorphic high electron mobility transistors (PHEMTs), or the like. While all the examples provided are single-ended devices, it should also be appreciated that the concepts of the present disclosure are applicable to differential, quadrature, or other devices. The stages may be combined in a Doherty, hybrid-combining, or outphasing fashion.

Figure 5A:
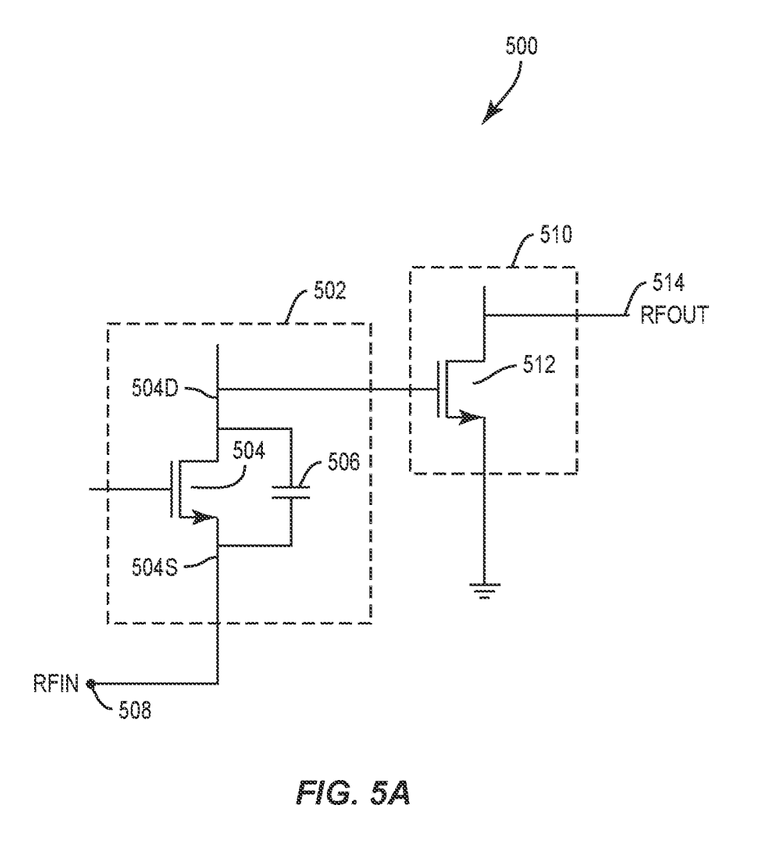
FIG. 5A is a circuit diagram of a power amplifier device having multiple stages where a first stage is a transimpedance stage with a parallel capacitor and a subsequent stage is a transconductance stage for the power amplifier device.

Still further, aspects of the present disclosure may be applied to a power amplifier device that has multiple stages and, in particular, has a transimpedance device in a first stage (e.g., a common-gate amplifier) and a transconductance device in a second stage (e.g., common-source amplifier), as better illustrated in FIG. 5A. In particular, a power amplifier device 500 may include a first stage 502 that includes a transimpedance device 504. The transimpedance device 504 may be a FET and, as illustrated, is an NFET. The transimpedance device 504 has a capacitor 506 coupled in parallel and thus is analogous to the middle cascode device 304 of FIG. 3. The capacitor 506 may be coupled to a drain 504D and a source 504S of the transimpedance device 504. The first stage 502 includes an input node 508 and couples to a second stage 510. The second stage 510 includes a transconductance device 512, which may be a FET. The second stage 510 couples to an output node 514. In operation, the capacitor 506 operates similarly to the capacitor 318. The transimpedance device 504 and the transconductance device 512 may be of any type and in any combination (n-type, p-type, complementary-type with both n and p).

Figure 5B:
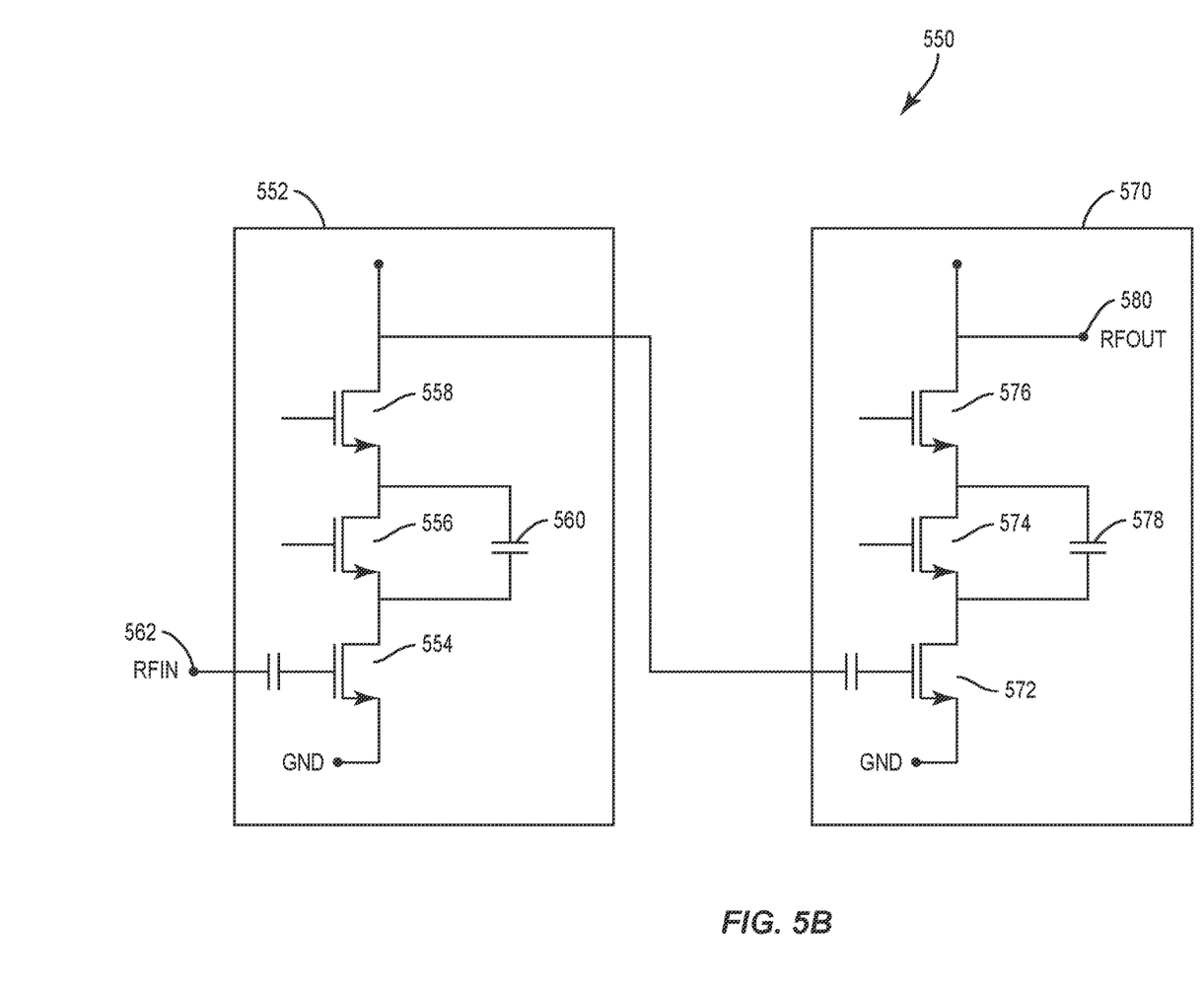
FIG. 5B is a circuit diagram of a power amplifier device having multiple stages where both stages have a middle cascode device with a parallel capacitance to improve phase linearity.

FIG. 5B shows an alternate embodiment of a multi-stage power amplifier 550 with a first stage 552 that includes a transconductance device 554 and associated middle cascode device 556 and top cascode transistor 558. The devices 554, 556, and 558 may be FETs and, as illustrated, are NFETs. The middle cascode device 556 has a capacitor 560 coupled in parallel and thus is analogous to the middle cascode device 304. The capacitor 560 may be coupled to a drain and a source of the middle cascode device 556. The first stage 552 includes an input node 562 and couples to a second stage 570. The second stage 570 includes a transconductance device 572 and associated middle cascode device 574 and top cascode transistor 576. The devices 572, 574, and 576 may be FETs and, as illustrated, are NFETs. The middle cascode device 574 has a capacitor 578 coupled in parallel and thus is analogous to the middle cascode device 304. The capacitor 578 may be coupled to a drain and a source of the middle cascode device 574. The top cascode transistor 576 may be coupled to a gate of the transconductance device 572, and the top cascode transistor 576 may be coupled to an output 580.

More complicated power amplifiers may be implemented, having any number of constituent stages, wherein at least one stage includes a cascode device and/or a transimpedance device that has a parallel capacitance connected to reduce the phase variation over power level, and thus linearize the stage.

Figure 6:
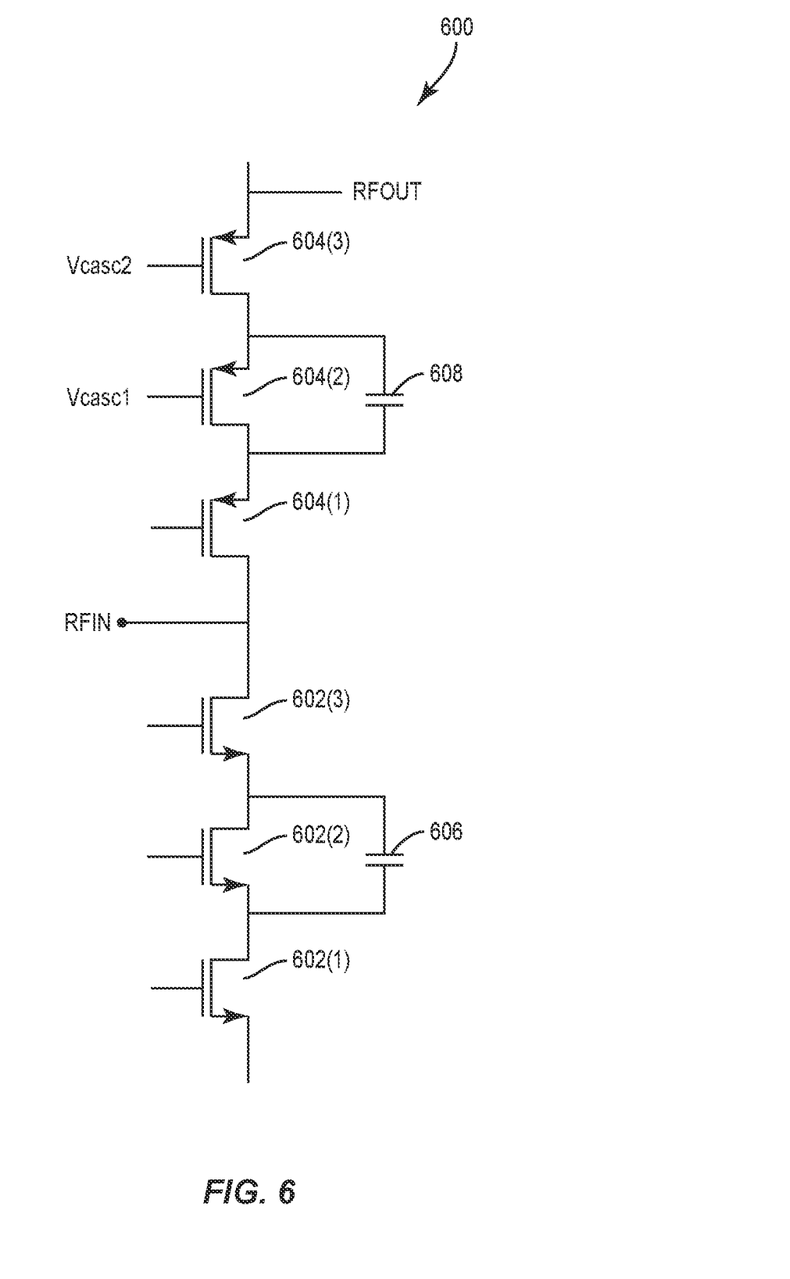
FIG. 6 is a circuit diagram of a complementary power amplifier stage having both p-type field effect transistors (FETs) (PFETs) and n-type FETs (NFETs) with parallel capacitors for cascode devices used in both sides of the power amplifier device.

FIG. 6 illustrates a CMOS power amplifier stage 600 that includes NFETs 602(1)-602(3) and PFETs 604(1)-604(3) that operate as transconductance, middle cascode, and top cascode transistors as is understood. Capacitors 606 and 608 are placed in parallel to the middle cascode devices 602(2) and 604(2) and function like the capacitor 318.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A power amplifier stage comprising:
a cascode device; and
a fixed value capacitor coupled in parallel with the cascode device, wherein the fixed value capacitor is configured to provide a first capacitance at a first radio frequency (RF) signal level and a second different capacitance at a second different RF signal level.

2. The power amplifier stage of claim 1, wherein the cascode device comprises a field effect transistor (FET).

3. The power amplifier stage of claim 2, further comprising a transconductance device coupled to the cascode device.

4. The power amplifier stage of claim 1, further comprising a second cascode transistor coupled to the cascode device.

5. The power amplifier stage of claim 2, wherein the FET comprises an n-type FET (NFET).

6. The power amplifier stage of claim 2, wherein the FET comprises a p-type FET (PFET).

7. The power amplifier stage of claim 2 implemented in a bulk complementary metal oxide semiconductor (CMOS) device.

8. The power amplifier stage of claim 2 implemented in a silicon on insulator (SOI) complementary metal oxide semiconductor (CMOS) device.

9. The power amplifier stage of claim 2 implemented in a silicon on sapphire (SOS) complementary metal oxide semiconductor (CMOS) device.

10. The power amplifier stage of claim 2, wherein the FET comprises a drain and a source and the fixed value capacitor is coupled to the drain and the source.

11. The power amplifier stage of claim 1, wherein the fixed value capacitor presents a large capacitance when the cascode device operates in a saturation mode as a function of the first RF signal level.

12. The power amplifier stage of claim 11, wherein the fixed value capacitor presents a small capacitance when the cascode device operates in a triode mode as a function of the second RF signal level.

13. A power amplifier device comprising:
a first stage comprising:
a first transistor comprising a drain and a source; and
a fixed value capacitor coupled between the drain and the source such that it is coupled electrically in parallel to the first transistor, wherein the fixed value capacitor is configured to act as a variable capacitor as a function of a radio frequency (RF) signal; and
a second stage comprising a second transistor coupled to the drain.

14. The power amplifier device of claim 13, wherein the first transistor and the second transistor comprise an n-type material or a p-type material.

15. The power amplifier device of claim 13, wherein the first transistor and the second transistor are implemented as a complementary metal oxide semiconductor (CMOS) device.

16. The power amplifier device of claim 13, wherein the first transistor and the second transistor are implemented in one of the following technologies: bulk complementary metal oxide semiconductor (CMOS), silicon on insulator (SOI) CMOS, and silicon on sapphire (SOS) CMOS.

17. A power amplifier device comprising:
a first stage comprising;
an input;
an output; and
a first transistor between the input and the output, the first transistor having coupled electrically in parallel a first fixed value capacitor, wherein the first fixed value capacitor is configured to act as a variable capacitor as a function of a first radio frequency (RF) signal; and
a second stage comprising;
a second input coupled to the output; and
a second transistor having coupled electrically in parallel a second fixed value capacitor, wherein the second fixed value capacitor is configured to act as a variable capacitor as a function of a second RF signal output from the first stage.

18. The power amplifier device of claim 17, wherein the first transistor and the second transistor are implemented with one of the following types of devices: n-type, p-type, or complementary (both n-type and p-type).

19. The power amplifier device of claim 17, wherein the first transistor and the second transistor are implemented in one of the following technologies: bulk complementary metal oxide semiconductor (CMOS), silicon on insulator (SOI) CMOS, and silicon on sapphire (SOS) CMOS.

20. The power amplifier device of claim 17, wherein the first transistor and the second transistor are implemented with different types of devices, one n-type and the other p-type.

* * * * *